United States Patent
Kobayashi

(10) Patent No.: US 7,465,218 B2
(45) Date of Patent: Dec. 16, 2008

(54) PROBE POLISHING METHOD AND PROBE POLISHING MEMBER

(75) Inventor: Masahito Kobayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/611,516

(22) Filed: Dec. 15, 2006

(65) Prior Publication Data

US 2007/0141956 A1    Jun. 21, 2007

(30) Foreign Application Priority Data

Dec. 19, 2005    (JP) .............................. 2005-364879

(51) Int. Cl.
*B24B 19/16*    (2006.01)

(52) U.S. Cl. .......................................... 451/28; 451/59

(58) Field of Classification Search .................. 451/28, 451/59, 526, 527, 533, 539
See application file for complete search history.

(56) References Cited

U.S. PATENT DOCUMENTS

| | | | | |
|---|---|---|---|---|
| 5,897,424 A * | 4/1999 | Evans et al. | .................... | 451/41 |
| 6,024,629 A * | 2/2000 | Takekoshi | .................... | 451/28 |
| 6,306,187 B1 * | 10/2001 | Maeda et al. | ................. | 51/298 |
| 6,741,086 B2 * | 5/2004 | Maekawa et al. | ........... | 324/754 |
| 7,182,672 B2 * | 2/2007 | Tunaboylu et al. | ............ | 451/36 |

* cited by examiner

*Primary Examiner*—Robert Rose
(74) *Attorney, Agent, or Firm*—Oblon, Spivak, McClelland, Maier & Neustadt, P.C.

(57) ABSTRACT

In a probe polishing method, a plurality of probes, which are arranged on a probe card for performing an inspection of electrical characteristics of a target object, are polished by using a polishing member. Further, the probes are polished over plural times, while changing a relative position of the abrasive sheet with respect to the probe card.

19 Claims, 5 Drawing Sheets

PROBE POLISHING METHOD AND PROBE POLISHING MEMBER

FIELD OF THE INVENTION

The present invention relates to a probe polishing method and a probe polishing member employed in a probe apparatus; and, more particularly, to a probe polishing method and a probe polishing member capable of reducing time required for polishing probes without increasing the size of the probe apparatus, thus improving a throughput of inspection with a small probe apparatus.

BACKGROUND OF THE INVENTION

As illustrated in FIG. 7, a conventional probe apparatus includes, in a probe chamber, a mounting table 1 for mounting thereon an object to be inspected (e,g., a wafer W) and incorporating therein an elevation mechanism and a rotation mechanism; an X-stage 2 supporting the mounting table 1 and movable in an X direction; a Y-stage 3 supporting the X stage 2 and movable in a Y direction; a probe card 4 disposed above the mounting table 1; and an alignment mechanism 5 for aligning probes 4A of the probe card 4 with the wafer W. In the probe chamber, after aligning the wafer W and the probes 4A by using the alignment mechanism 5, the mounting table 1 is moved in X, Y, Z directions on a base 6 by means of the X-stage 2, the Y-stage 3 and the elevation mechanism to bring the wafer W into an electric contact with the probes 4A, whereby electrical characteristics of the wafer W are inspected by the probes 4A. The X-stage 2 and the Y-stage 3 are individually moved in the X and Y directions, by driving mechanisms connected to ball screws, respectively. FIG. 7 shows a ball screw 2B included in the driving mechanism of the X-stage 2 and a motor 3A included in the driving mechanism of the Y stage 3.

Further, as shown in FIG. 7, the alignment mechanism 5 includes a lower charge coupled device (CCD) camera 5A and an upper CCD camera 5B and is operated under the control of a controller. The lower CCD camera 5A is installed at the mounting table 1 to capture an image of the probes 4A of the probe card 4 from below, while the upper CCD camera 5B is disposed at the center of an alignment bridge 5C to capture an image of the wafer W on the mounting table 1 from above. The alignment bridge 5C is moved from an innermost side in the probe chamber to a probe center in a direction marked by an arrow in FIG. 7 along a pair of guide rails (not shown) that are extended in the Y direction (front-rear direction).

In performing an inspection of the wafer W, the alignment mechanism 5 aligns electrode pads of the wafer W with the probes 4A. Then, by moving the mounting table 1 in the X, Y, and Z directions, the electrode pads of the wafer W are brought into electric contact with the probes 4A to inspect the electrical characteristics of the wafer W. As the inspection is repeated, metal oxides on the surface of the electrode pad are worn away and adhered to needle tips of the probes 4A, which would hinder following inspections. Thus, the needle tips of the probes 4A are polished by using a polishing member 7 shown in FIG. 7 to remove the particles adhered to the needle tips.

Meanwhile, if the number of devices simultaneously measured by the probes 4 increases as the size of the probe card 4 is increased, the area of the probe card 4 occupied by the probes 4A (hereinafter, simply referred to as "probe area") gets larger than the size of the polishing member 7, so that it becomes impossible to polish the probes 4A with the conventional polishing member 7. In such a case, though the probes 4A may be polished after separating the probe card 4 from the probe apparatus, a considerable amount of time is required for the separation and reinstallation of the probe card 4, which results in deterioration of a polishing efficiency.

Japanese Patent Laid-open Application No. 2000-164649 (Reference 1) discloses a method for polishing probes by using a polishing member of a wafer size mounted on the mounting table 1 without separating the probe card from the probe apparatus. Further, Japanese Patent Laid-open Application No. 2000-183119 (Reference 2) describes a probe apparatus using a polishing member having a size suitable for a probe area of a probe card, wherein the polishing member can be rotated to correspond to a direction of the probe area which varies depending on the type of the probe card.

In Reference 1, though the polishing member can be changed in accordance with the type of the probe card, the polishing member has to be newly installed every time a polishing of probes is conducted. Thus, a considerable amount of time is required for the installation of the polishing member, so that the efficiency of the polishing work is deteriorated. Further, an additional device for installing the polishing member is required, thereby increasing a cost. Besides, in case of a large probe card capable of contacting with the entire region of a wafer at one time, although it is possible to polish all of the probes of the probe card simultaneously, it is inevitable that the same portions of the polishing member are used repetitively because the polishing member cannot be index fed. Thus, the polishing member cannot be utilized efficiently. Moreover, due to the large size of the polishing member, an extra space is required for the accommodation of the polishing member, which increases the entire size of the probe apparatus.

In Reference 2, to change the direction of the polishing member having a size suitable for a probe area to correspond to the direction of the probe area, the polishing member sometimes needs to be elevated higher than a mounting surface of the mounting table depending on the direction of the probe area. Thus, a rotation mechanism and an elevation mechanism for the polishing member are additionally needed, which makes the entire mechanism of the probe apparatus complicated. Further, since the same portions of the polishing member are repetitively used to polish probes as similar to the case of Reference 1, the work efficiency of the polishing member is poor. Moreover, there are required the extra space for accommodating the polishing member having the size suitable for the probe area and a space for allowing the direction change of the polishing member, so that the entire size of the probe apparatus is increased.

SUMMARY OF THE INVENTION

It is, therefore, an object of the present invention to provide a probe polishing method and a probe polishing member capable of polishing probes of a probe card reliably and efficiently even when the arrangement region of the probes is not fully covered by the polishing member because the number of the probes increases as a size of the probe card becomes larger, thus improving inspection throughput.

In accordance with an embodiment of the present invention, there is provided a probe polishing method for polishing, by using a polishing member, a plurality of probes arranged on a probe card for performing an inspection of electrical characteristics of a target object, wherein the probes are polished over plural times, while changing a relative position of the polishing member with respect to the probe card.

Preferably, the same probes are polished more than one time with different portions of the polishing member each time by changing the relative position of the polishing member with respect to the probe card.

Preferably, the polishing member is installed on a movable mounting table for mounting the target object thereon, and the polishing member is moved by using the mounting table.

Preferably, an abrasive sheet is used as the polishing member, and the abrasive sheet has a slant portion at a peripheral portion thereof, the slant portion being inclined outwardly downwardly.

Preferably, the abrasive sheet includes an abrasive layer and a cushion layer formed under the abrasive layer.

In accordance with one aspect of the present invention, a polishing member used to polish probes for performing an inspection of electrical characteristics of a target object, the polishing member being mounted on a support, the polishing member including: a slant portion at a peripheral portion of the polishing member, the slant portion being inclined outwardly downwardly.

Preferably, the support is installed at a mounting table for mounting the target object thereon, and the support has a slant surface at a peripheral portion thereof, the slant surface being inclined outwardly downwardly.

Preferably, the polishing member is formed of an abrasive sheet including an abrasive layer and a cushion layer formed under the abrasive layer.

In accordance with the present invention of any one of claims 1 to 8, there can be provided a probe polishing method and a probe polishing member capable of polishing probes of a probe card certainly and efficiently even when the arrangement region of the probes is not fully covered by the polishing member because the number of the probes increases as a size of the probe card becomes larger, thus improving a throughput of inspection.

BRIEF DESCRIPTION OF THE DRAWINGS

The above and other objects and features of the present invention will become apparent from the following description of exemplary embodiments given in conjunction with the accompanying drawings, in which.

DETAILED DESCRIPTION OF THE EMBODIMENTS

Hereinafter, an embodiment of the present invention will be described with reference to FIGS. 1 to 6.

Figure 1:
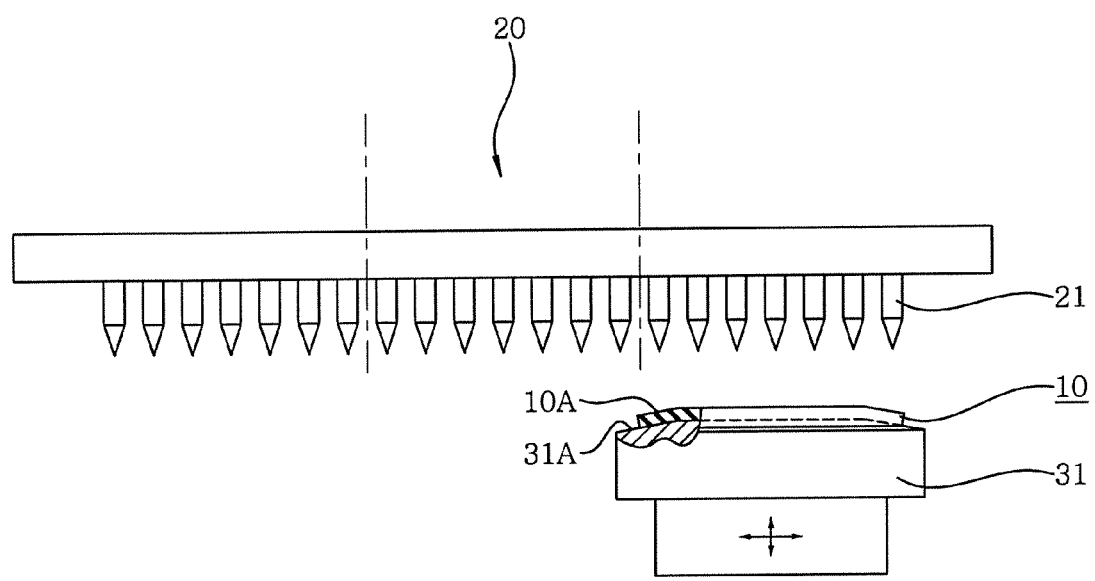
FIG. 1 is a side view schematically illustrating a probe polishing method of the present invention.
Figure 2:
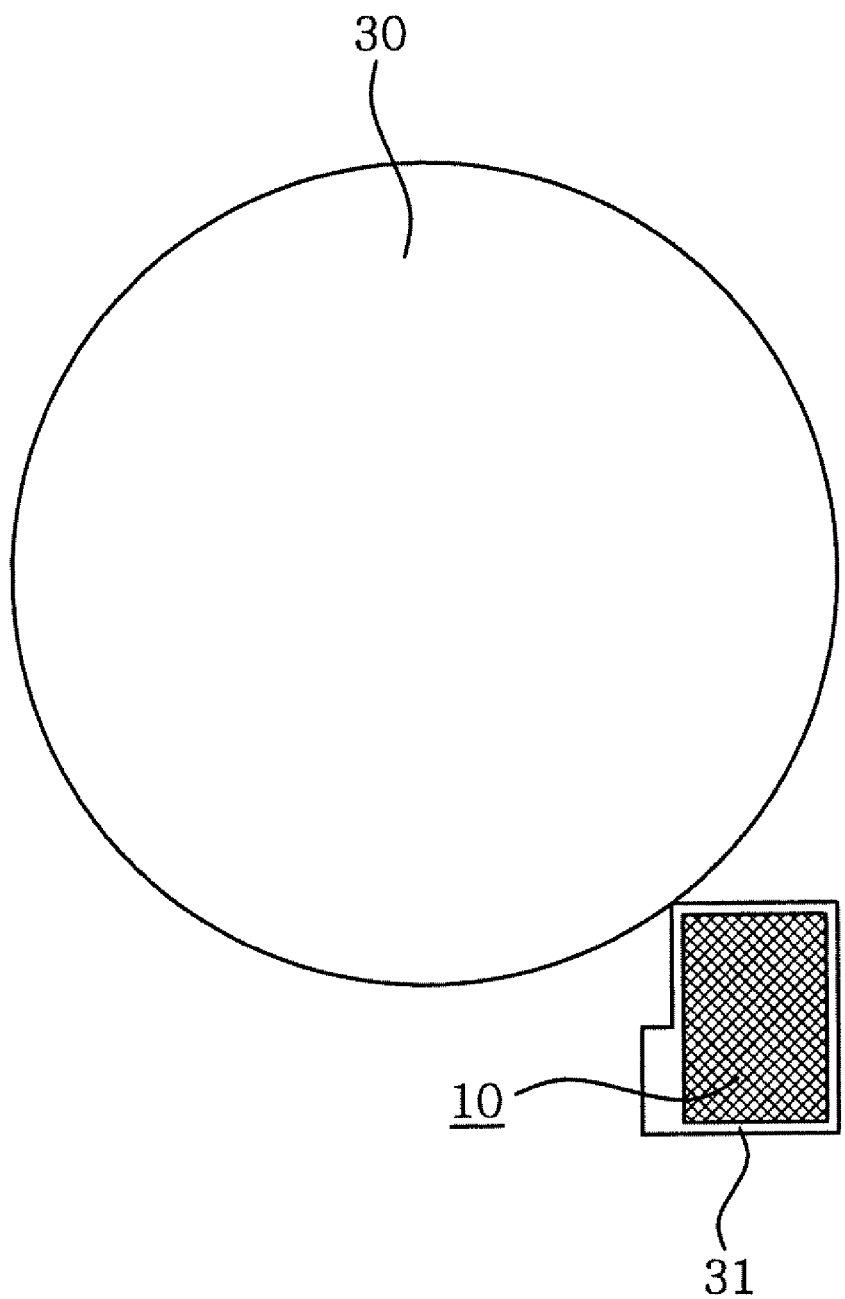
FIG. 2 sets forth a plane view illustrating a mounting table of a probe apparatus having a polishing member shown in FIG. 1.

As schematically illustrated in FIG. 1, for example, a polishing member 10 in accordance with the embodiment of the present invention is formed to have a size smaller than an arrangement area of a plurality of probes 21 attached on a probe card 20 (hereinafter, simply referred to as "probe area"). That is, the probe area is larger than the size of the polishing member 10 such that the entire region of the probe area is not fully covered by the polishing member 10. As shown in FIG. 2, for example, the polishing member 10 is disposed on a support 31 installed at a periphery of a mounting table 30 for supporting a to-be-inspected object such as a wafer (not shown). The mounting table 30 is configured to be movable in X, Y, Z and θ directions as in the conventional cases. The support 31 is horizontally protruded from a part of the periphery of the mounting table 30, and supports the polishing member 10 thereon such that the surface of the polishing member 10 is positioned slightly higher than a mounting surface of the mounting table 30.

Since the polishing member 10 cannot polish all the probes 21 in the probe area at one time, as shown in FIG. 1, the probes 21 in the probe area divided into plural groups (e.g., three groups bordered by dashed dotted lines in FIG. 1), and a polishing operation is individually performed for each group (over three times in total in FIG. 1) by index feeding the polishing member 10 by means of the mounting table 30.

Further, the planar shape of the polishing member 10 can be appropriately set as desired. For example, as illustrated in FIG. 2, the polishing member 10 is formed to have a rectangular shape. Further, since the polishing member 10 is a consumptive member, it is attachably and detachably mounted on the top surface of the support 31 so that it can be replaced with a new one. The polishing member 10 may be formed of a flexible abrasive sheet or an abrasive plate made up of, e.g., an alumina ceramic. In this embodiment, the polishing member 10 is formed of a flexible abrasive sheet. Thus, in the following description, the polishing member 10 will be explained as an abrasive sheet 10. In this embodiment, the polishing member 10 has a hard abrasive, so that it is particularly effective to polish probes with the surface of the abrasive. Here, the surface hardness of the polishing member 10 is set to be higher than that of a material forming the probes 21. For example, in case the probes 21 are made up of tungsten which has a Mohs hardness of 7.5 and, thus, an abrasive whose Mohs hardness is more than a value of 8, e.g., 9 is used for the polishing member 10, alumina whose particle diameter ranging from 0.5 to 10 μm can be used as the abrasive.

As shown in FIG. 1, the top surface of the support 31 has a slant surface 31A provided at the peripheral portion of the support 31, the slant portion being inclined outwardly downwardly. Here, the abrasive sheet 10 is formed to have a size enough to cover the slant surface 31A of the support 31. The abrasive sheet 10 is attached on the support 31 having the slant surface 31A, so that the abrasive sheet 10 is made to conform to the contour of the top surface of the support 10 and the peripheral portion of the abrasive sheet 10 has a slant portion 10A inclined outwardly downwardly. Here, the abrasive sheet 10 may be configured to have a size covering the entire region of the flat surface portion or just covering a part of slant surface 31A as shown in FIG. 1. The slant portion 10A of the abrasive sheet 10 is designed to have a length of, e.g., 5 mm (5 mm or above is preferable) and to have a degree of inclination of, e.g., 10% (10% or less is preferable). By configuring the abrasive sheet 10 to have the slant portion 10A at the peripheral portion thereof, leading ends of the probes 21 located outside the boundaries (marked by dashed dotted lines in FIG. 1) of a polishing region of the probe area, which is being polished by the abrasive sheet, are increasingly distanced away from the abrasive sheet 10 as they are located farther from the polishing region. Thus, during the index feeding of the abrasive sheet 10 for the polishing of the probes 21, the probes 21 located adjacent to the polishing region are prevented from being bent or damaged by the peripheral portion of the abrasive sheet 10, thereby keeping the arrangement of the probes 21 in order.

Figure 3:
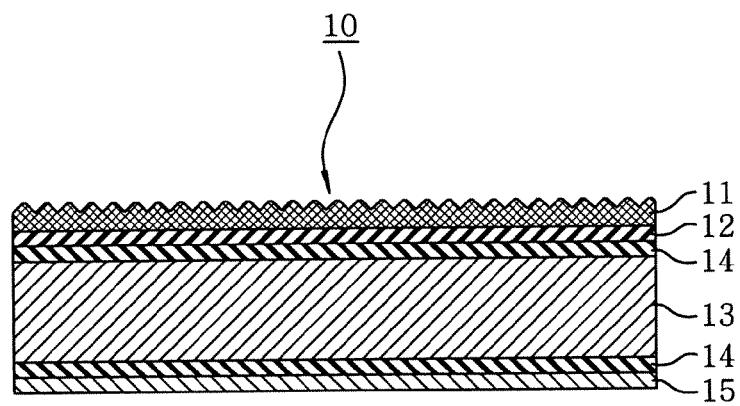
FIG. 3 provides a cross sectional view illustrating the polishing member shown in FIG. 1.

Further, as shown in FIG. 3, for example, the abrasive sheet 10 includes an abrasive layer 11; a film layer 12 supporting the abrasive layer 11; and a cushion layer 13 supporting the film layer 12. The abrasive layer 11 is formed by coating fine powder of, e.g., alumina, which is employed as the abrasive, on the film layer 12. The film layer 12 is made up of, e.g., a polyethylene terephthalate (PET) resin or the like and the cushion layer 13 is made up of an expandable resin (e.g., acryl foam) having a high elasticity. Further, an adhesive layer 14 made up of, e.g., an acryl-based resin material is formed on the top and the bottom surface of the cushion layer 13. Further, reference numeral 15 represents a liner film which is removed when attaching the abrasive sheet 10 to the support 31. The thickness of the abrasive sheet 10 can be appropriately set as desired. For example, the thickness of the abrasive sheet 10 (excepting for the liner film 15) is set to be, e.g., about 500 μm, wherein the sum of the thicknesses of the abrasive layer 11 and the film layer 12 is set to be, e.g., about 200 μm; and the sum of the thicknesses of the cushion layer 13 and the adhesive layers 14 is set to be, e.g., about 300 μm. It is preferable that the fine powder of the abrasive such as alumina or the like is set to have a particle diameter smaller than the diameter of leading ends of the probes 21. The diameter of the leading ends of the probes 21 is set to range, e.g., from about 10 to 20 μm; the length of probe tips is set to be, e.g., about 200 μm; and the interval between the probes 21 is set to be about 50 to 200 μm.

Below, an embodiment of the polishing method in accordance with the present invention will be described with reference to FIGS. 4 to 6B. FIGS. 5A, 5B and 6A, 6B illustrate a polishing method wherein the probe area is divided into two.

In an inspection process of a wafer, after the wafer is loaded on the mounting table 30, the wafer is aligned with the probes 21 of the probe card by an alignment mechanism (not shown). Then, the wafer is horizontally moved to a first inspection position by using the mounting table 30, and the wafer is elevated and overdriven by a specific amount by means of the mounting table 30 to be brought into contact with the probes 21. Accordingly, electrode pads of the wafer and the probes 21 are brought into electric contact with each other and electrical characteristics of the wafer are inspected. Thereafter, the mounting table 30 is moved downward, and the wafer is index fed through the mounting table 30 to a next inspection position, where the same inspection process as described above is repeated. During the inspection of the wafer, the probes 21 pick oxide films formed on the electrode pads to make electric connections therebetween. Thus, as the inspection is repeated, particles of the oxide films are adhered to leading ends of the probes 21, which would hinder following inspections.

Figure 4:
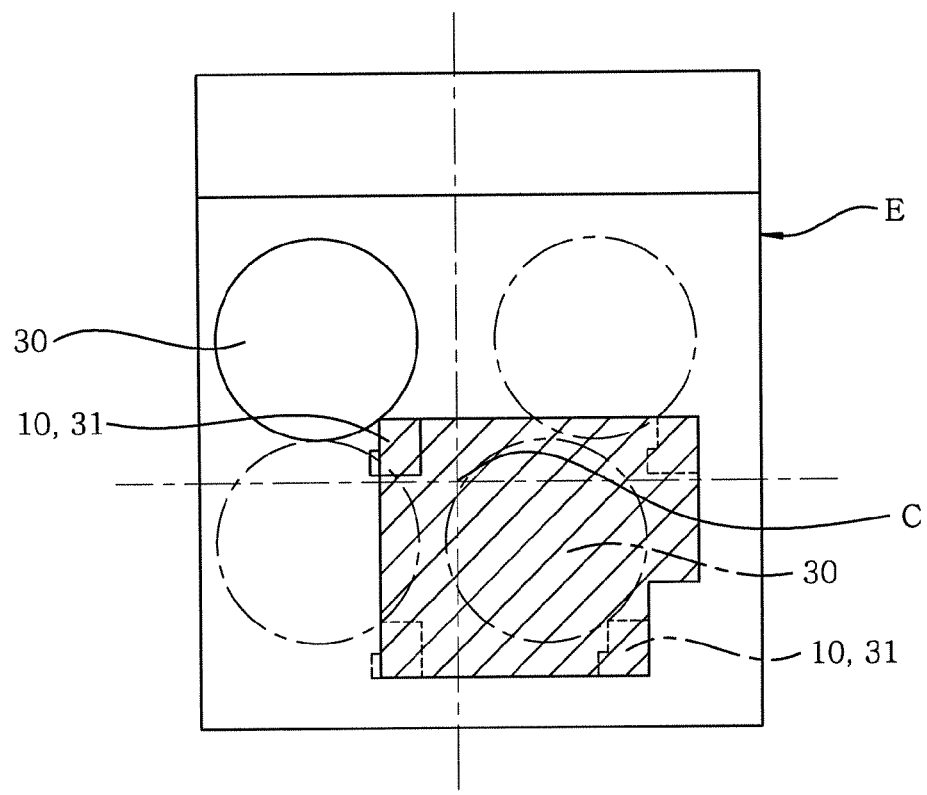
FIG. 4 depicts a plane view illustrating a movement area of the polishing member shown in FIG. 1.

Thus, the probe polishing method in accordance with the present invention is performed to remove the particles from the probes 21. The probes 21 in the probe area are polished by the abrasive sheet 10, while index feeding the abrasive sheet 10 by means of the mounting table 30. FIG. 4 shows a polishing region of the abrasive sheet 10 that can be covered by the index feeding of the mounting table 30, which is hatched in FIG. 4. The probe card 20 is installed in a probe apparatus E in a manner that the center of its probe area coincides with a probe center C of the probe apparatus E. The probe area is within the polishing region, and all the probes 21 can be polished through the index feeding of the mounting table 30.

The polishing process of the probes 21 is performed as follows. First, prior to the polishing, each size of the probe area of the probe card 20 and the abrasive sheet 10 is registered in a controller of the probe apparatus, whereby the controller determines whether to polish the whole probe area at one time or to polish the probe area over plural times by grouping it into plural sections based on the sizes of the probe area and the abrasive sheet 10. In case the probe area is larger than the abrasive sheet 10, the controller automatically calculates the number of the polishing operations to be performed based on the registered size information of the probe area and the abrasive sheet 10. Alternatively, an operator may set the number of the polishing operations to be performed. In the examples shown in FIGS. 5A, 5B and 6A, 6B, the probe area is polished over two times. Further, the probe area will be explained by providing reference numeral 23 to the probe area blow.

Figures 5A, 5B:
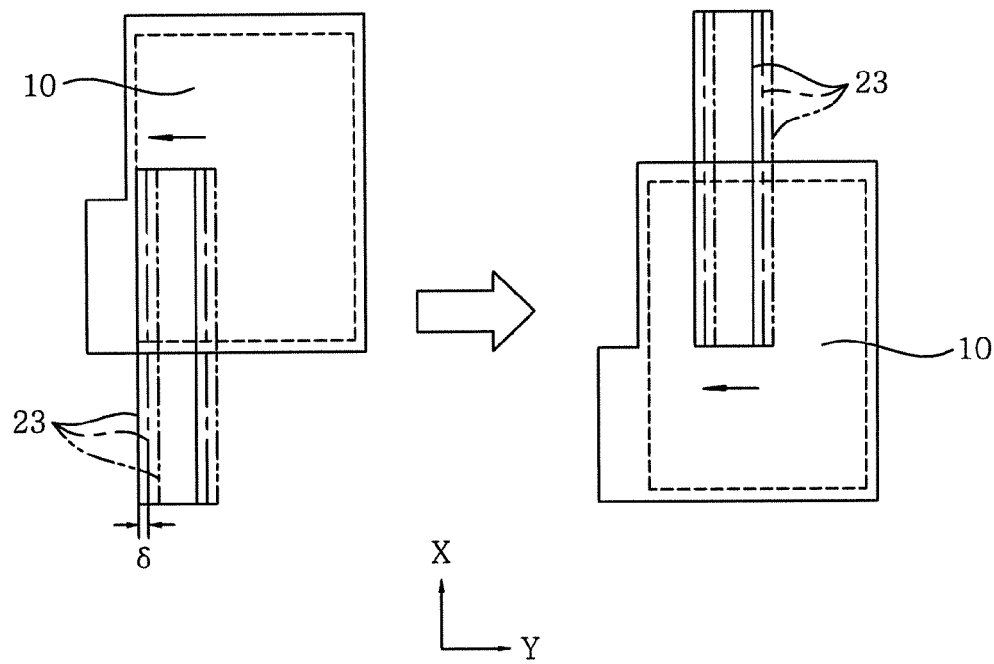
FIGS. 5A and 5B present plane views illustrating a first embodiment of the polishing method of the present invention.

As shown in FIGS. 5A and 5B, in case a probe area 23 is elongated in a X-direction in the drawings, the probe area 23 is divided into, e.g., two, an upper and a lower portion in the drawings. Then, by moving a mounting table (not shown), the abrasive sheet 10 is moved to a position, e.g., where the upper portion of the probe area 23 is positioned above a lower left side of the abrasive sheet 10, as shown in FIG. 5A. In this state, the abrasive sheet 10 is elevated by the mounting table to come into contact with the probes 21 at the upper portion of the probe area 23, and the abrasive sheet 10 is overdriven by about 50 to 100 μm, e.g., 50 μm, whereby leading ends of the probes 21 collide with the abrasive layer 11 (see FIG. 3). The abrasive contained in the abrasive layer 11 scratches or peels particles adhered to the leading ends of the probes 21. Thereafter, the abrasive sheet 10 is descended down to its lowermost position to be separated from the probe area 21. In this way, the particles attached on the leading ends of the probes 21 can be removed, and the removed particles are left on the abrasive layer 11. By setting a contact area of the probes with the slant portion 10A of the abrasive sheet 10, which is determined by an overdriving amount and a degree of inclination of the slant portion 10A, not to exceed ½ of the slant portion 10A in a horizontal direction, any damage on probes can be reliably prevented.

Though the particles adhered on the leading ends of the probes 21 can sometime be removed by a single polishing operation, some particles may remain after the single polishing operation. In such cases, the abrasive sheet 10 is index fed by a specific distance δ by moving the mounting table, so that the abrasive sheet 10 is displaced in a horizontal direction (Y direction) marked by an arrow in FIG. 5A. Then, as described above, the abrasive sheet 10 is overdriven; and the remaining particles on the probes can be removed by using a separate new portion of the abrasive sheet 10; and then, the abrasive sheet is descended. By changing the polishing portion of the abrasive sheet 10 as described above, the efficiency of removing the particles from the probes can be improved. That is, by shifting the abrasive sheet 10 in the Y direction as many time as necessary, the same portion of the probe area 23 can be polished plural times, so that the particles adhered to the probe areas 23 can be completely removed.

After polishing the upper portion of the probe area 23, the abrasive sheet 10 is moved downward in the X direction by means of the mounting table to allow the lower portion of the probe area 23 to be positioned above the abrasive sheet 10. Then, the lower portion of the probe area 23 is polished in the same manner as that for polishing the upper portion of the probe area 23. If necessary, the probes 21 on the lower portion of the probe area are polished repetitively by index feeding the abrasive sheet 10 over plural times.

Figures 6A, 6B:
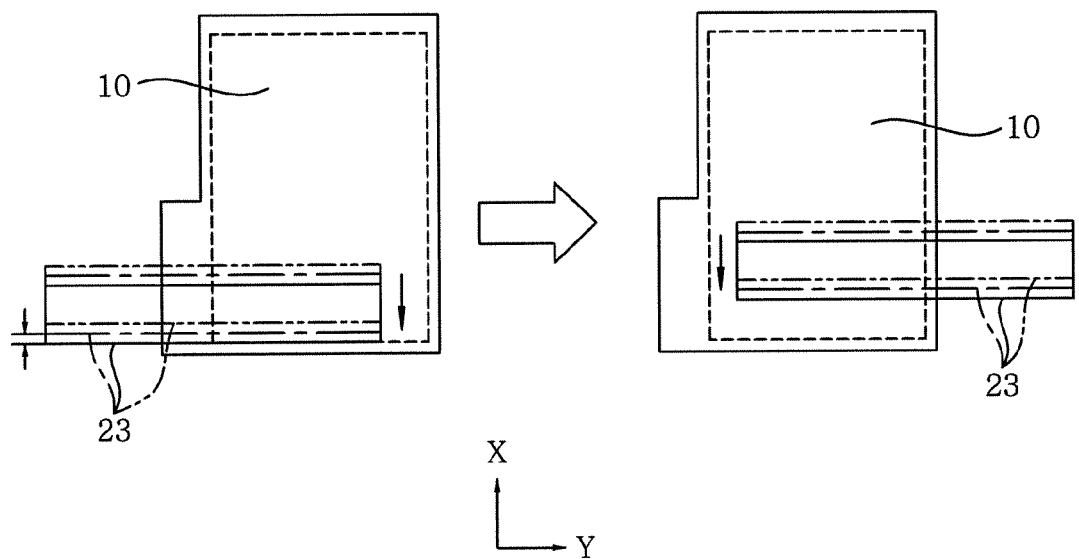
FIGS. 6A and 6B offer plane views illustrating a second embodiment of the polishing method in accordance with the present invention.
Figure 7:
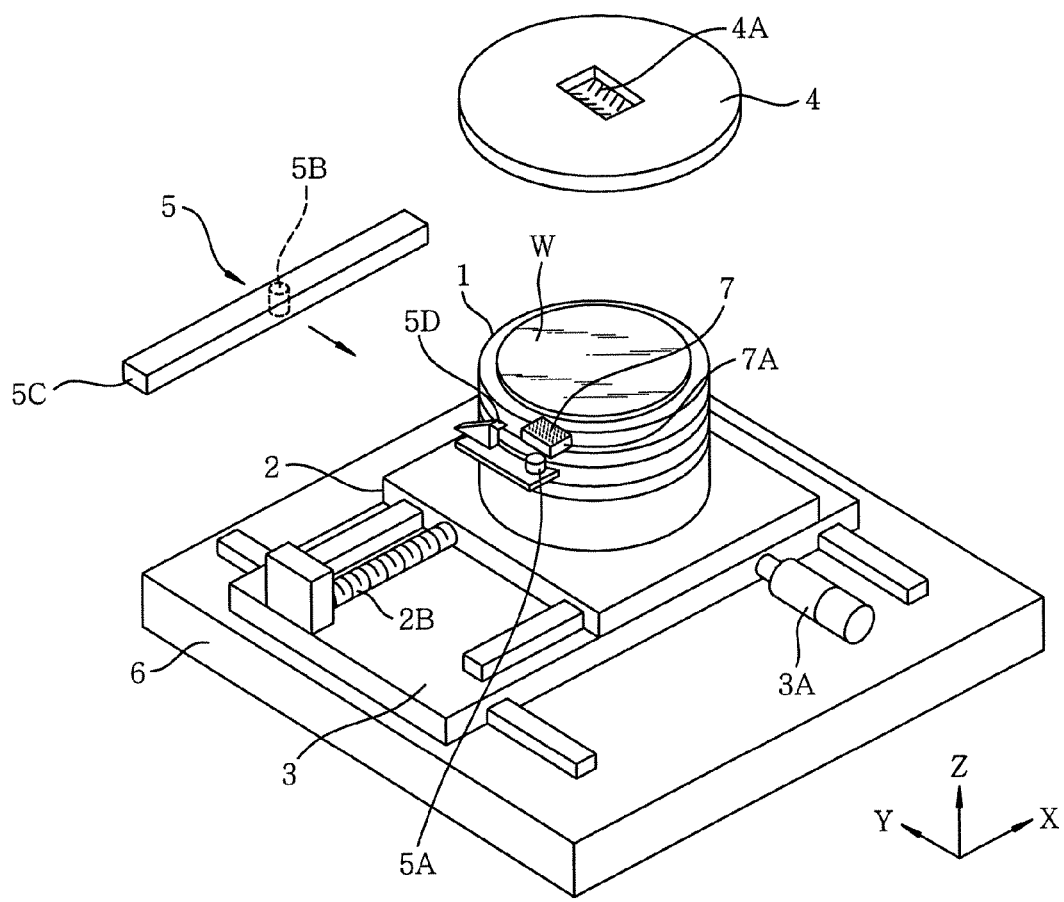
FIG. 7 is a perspective view illustrating major components of a conventional probe apparatus.

Further, as shown in FIGS. 6A and 6B, in case the probe area 23 is elongated in a Y-direction, a right half of the probe area 23 is first polished, e.g., as shown in FIG. 6A, and if necessary, the same probes 21 are polished repetitively by index feeding the abrasive sheet 10 downward through the mounting table by a distance δ, as shown by an arrow in FIG. 6A. Then, the abrasive sheet 10 is moved as shown in FIG. 6B to polish the remaining left half of the probe area 23 in the same manner as that of the right half.

In accordance with the embodiment of the present invention as described above, since the abrasive sheet 10 has the slant portion 10A inclined outwardly downwardly, the peripheral portion of the abrasive sheet 10 can hardly make a contact with the probes 21 even in case the probe area 23 is not fully covered by the abrasive sheet 10. Thus, it is possible to polish the probe area 23 completely and effectively by dividing it into plural regions without disordering the arrangement of the probes 21. Accordingly, even if the size of the probe card 20 is increased and the probe area 23 cannot be completely covered by the abrasive sheet 10, the probe area 23 can be polished by using the same abrasive sheet 10 without having to separate the probe card 20, by way of dividing the probe area 23 into plural polishing regions and moving the abrasive sheet 10 by means of the mounting table 30. Therefore, the probe area 23 can be polished completely in a shorter period of time, thereby improving a throughput of inspection. Moreover, since the polishing member 10 only needs attaching to and detaching from the top surface of the support 31 installed at the mounting table 30, its structure can be simplified and costs can be reduced. Further, since a separate space for the polishing operation is not required, a size increase of the probe apparatus can be prevented.

Further, in accordance with the embodiment of the present invention, since the same probes 21 on the probe area can be polished plural times with different portions of the abrasive sheet 10 by index feeding the abrasive sheet 10 by means of the mounting table 30, the particles on the probes 21 can be removed completely and efficiently. In addition, since the abrasive sheet 10 has the abrasive layer 11 and the cushion layer 13, the probes 21 are allowed to collide with the abrasive layer 11 elastically, so that the damage on the probes 21 can be prevented.

Furthermore, the present invention is not limited to the embodiments described above, but the design of each component can be varied appropriately if necessary. For example, though the embodiments have been described for the case where the slant portion 10A of the abrasive sheet 10 is formed by attaching the abrasive sheet 10 on the slant surface 31A of the support 31, it is also possible to form a slant surface portion at the peripheral portion of the abrasive sheet 10 itself. In such a case, it is preferable to provide the slant surface at the cushion layer 13. In addition, although the embodiments have been described for the case where the probe area is not fully covered by the abrasive sheet, the polishing method of the present invention can also be applied to a case where the abrasive sheet can cover the entire probe area.

While the invention has been shown and described with respect to the embodiments, it will be understood by those skilled in the art that various changes and modifications may be made without departing from the scope of the invention as defined in the following claims.

What is claimed is:

1. A probe polishing method for polishing, by using a polishing member, a plurality of probes arranged on a probe card for performing an inspection of electrical characteristics of a target object, wherein the probes are divided into multiple groups and the probes are polished on a group-by-group basis by a repeated polishing operation polishing the individual groups successively by changing a relative position of the polishing member with respect to the probe card, and wherein the polishing member is mounted on a support installed at a periphery of a movable mounting table for mounting the target object thereon, and the polishing member is moved by using the mounting table.

2. The method of claim 1, wherein each group is polished more than one time with different portions of the polishing member each time by placing a different portion of the polishing member under each group and then overdriving the polishing member against each group.

3. The method of claim 1, wherein an abrasive sheet is used as the polishing member, and the abrasive sheet has a slant portion at a peripheral portion thereof, the slant portion being inclined outwardly downwardly.

4. The method of claim 3, wherein the abrasive sheet includes an abrasive layer and a cushion layer formed under the abrasive layer.

5. A method for polishing probes arranged in a probe area of a probe card by using a polishing member, the probe area being lager than the size of the polishing member such that the probe area is not fully covered by the polishing member, comprising:

dividing the probes in the probe area into multiple groups; and polishing the probes by performing polishing operation on a group-by-group basis by a repeated polishing operation polishing the individual groups successively, wherein probes in one group are polished simultaneously in one polishing operation, wherein the polishing member is mounted on a support installed at a periphery of a movable mounting table for mounting an object to be inspected by the probe card thereon, and the polishing member is moved by using the mounting table.

6. The method of claim 5, wherein the polishing operation comprises:

placing the polishing member under a group of probes; and then overdriving the polishing member against the group of probes.

7. The method of claim 6, wherein each group is polished more than one time by repeating the polishing operation with different portions of the polishing member.

8. The method of claim 1, wherein the support is horizontally protruded from a part of the periphery of the mounting table.

9. The method of claim 1, wherein the support supports the polishing member thereon such that a surface of the polishing member is positioned higher than a mounting surface of the mounting table.

10. The method of claim 1, wherein before polishing the probes, the size of a probe area of the probe card, the probes being arranged in the probe area, and the size of the polishing member are registered, and the number of the groups is calculated by using the registered sizes of the probe area and the polishing member.

11. The method of claim 1, wherein the probe card and the mounting table are installed in a probe apparatus and the polishing operation is performed without separating the probe card and the mounting table from the probe apparatus.

12. The method of claim 3, wherein a contact area of probes in one group contacting with the slant portion of the polishing member in one polishing operation is set to be less than ½ of the slant portion in a horizontal direction.

13. The method of claim 5, wherein the support is horizontally protruded from a part of the periphery of the mounting table.

14. The method of claim 5, wherein the support supports the polishing member thereon such that a surface of the polishing member is positioned higher than a mounting surface of the mounting table.

15. The method of claim 5, wherein before polishing the probes, the size of the probe area and the size of the polishing member are registered, and the number of the groups is calculated by using the registered sizes of the probe area and the polishing member.

16. The method of claim 5, wherein the probe card and the mounting table are installed in a probe apparatus and the polishing operation is performed without separating the probe card and the mounting table from the probe apparatus.

17. The method of claim 5, wherein an abrasive sheet is used as the polishing member, and the abrasive sheet has a slant portion at a peripheral portion thereof, the slant portion being inclined outwardly downwardly.

18. The method of claim 17, wherein a contact area of the probes in one group contacting with the slant portion of the polishing member in one polishing operation is set to be less than ½ of the slant portion in a horizontal direction.

19. A method for polishing probes arranged in a probe area of a probe card by using a polishing member, the probe area being larger than the size of the polishing member such that the probe area is not fully covered by the polishing member, comprising:

dividing the probes in the probe area into multiple groups; and polishing the probes by performing a repeated polishing operation on a group-by-group basis of respective ones of the groups successively, wherein probes in one group are polished simultaneously in one polishing operation, wherein the probe card and the mounting table are installed in a probe apparatus and the polishing operation is performed without separating the probe card and the mounting table from the probe apparatus.

\* \* \* \* \*